United States Patent
Ha et al.

(10) Patent No.: US 9,224,820 B2
(45) Date of Patent: Dec. 29, 2015

(54) OXIDE SEMICONDUCTOR SPUTTERING TARGET, METHOD OF MANUFACTURING THIN-FILM TRANSISTORS USING THE SAME, AND THIN FILM TRANSISTOR MANUFACTURED USING THE SAME

(71) Applicant: Samsung Corning Advanced Glass, LLC, Chungcheongnam-do (KR)

(72) Inventors: Jinjoo Ha, ChungCheongNam-Do (KR); Seungju Lee, ChungCheongNam-Do (KR); Joo Hye Oh, ChungCheongNam-Do (KR); Johann Cho, ChungCheongNam-Do (KR); Ju Ok Park, ChungCheongNam-Do (KR); In Sung Sohn, ChungCheongNam-Do (KR); Hyungrok Lee, ChungCheongNam-Do (KR); Jin Woo Han, ChungCheongNam-Do (KR)

(73) Assignee: Samsung Corning Advanced Glass, LLC (KR)

( * ) Notice: Subject to any disclaimer, the term of this patent is extended or adjusted under 35 U.S.C. 154(b) by 12 days.

(21) Appl. No.: 13/904,344

(22) Filed: May 29, 2013

(65) Prior Publication Data

US 2013/0320336 A1     Dec. 5, 2013

(30) Foreign Application Priority Data

May 31, 2012  (KR) .................. 10-2012-0057851
May 8, 2013   (KR) .................. 10-2013-0051644

(51) Int. Cl.
    *H01L 29/24*     (2006.01)
    *H01L 21/02*     (2006.01)
    *H01L 29/786*    (2006.01)
    (Continued)

(52) U.S. Cl.
    CPC ............ *H01L 29/24* (2013.01); *C23C 14/3414* (2013.01); *H01L 21/02565* (2013.01); *H01L21/02631* (2013.01); *H01L 29/66969* (2013.01); *H01L 29/7869* (2013.01); *H01L 29/78693* (2013.01)

(58) Field of Classification Search
    CPC ................... H01L 29/7869; H01L 29/78693; H01L 21/02565; H01L 21/02631; H01L 29/24; H01L 29/66969; C23C 14/3414
    USPC ........................................... 257/43; 438/104
    See application file for complete search history.

(56) References Cited

U.S. PATENT DOCUMENTS

5,407,602 A * 4/1995 Cava .......................... 252/519.1
5,473,456 A * 12/1995 Cava et al. .................... 349/139

(Continued)

FOREIGN PATENT DOCUMENTS

JP    20110174134 A       9/2011
WO    WO 2011105047 A1 *  9/2011

OTHER PUBLICATIONS

English Translation of WO 2011105047 A1.*

*Primary Examiner* — Matthew Landau
*Assistant Examiner* — Eric Ward
(74) *Attorney, Agent, or Firm* — Lerner, David, Littenberg, Krumholz & Mentlik, LLP

(57) ABSTRACT

An oxide semiconductor sputtering target which is used for depositing a thin film having high electron mobility and high operational reliability, a method of manufacturing thin-film transistors (TFTs) using the same, and a TFT manufactured using the same. The oxide semiconductor sputtering target is used in a sputtering process for depositing an active layer on a TFT. The oxide semiconductor sputtering target is made of a material based on a composition including indium (In), tin (Sn), gallium (Ga) and oxygen (O). The method includes the step of depositing an active layer using the above-described oxide semiconductor sputtering target. The thin-film transistor may be used in a display device, such as a liquid crystal display (LCD) or an organic light-emitting display (OLED).

6 Claims, 5 Drawing Sheets

(51) Int. Cl.
*C23C 14/34* (2006.01)
*H01L 29/66* (2006.01)

(56) References Cited

U.S. PATENT DOCUMENTS

| | | | |
|---|---|---|---|
| 6,042,752 A * | 3/2000 | Mitsui | 252/520.1 |
| 7,611,646 B2 * | 11/2009 | Nakayama et al. | 252/518.1 |
| 8,440,115 B2 * | 5/2013 | Nakayama et al. | 252/520.1 |
| 2009/0278120 A1 | 11/2009 | Lee et al. | |
| 2010/0155717 A1 * | 6/2010 | Yano et al. | 257/43 |
| 2011/0220895 A1 | 9/2011 | Hirai et al. | |
| 2011/0260118 A1 * | 10/2011 | Yano et al. | 252/512 |
| 2011/0278567 A1 | 11/2011 | Ye | |
| 2012/0313057 A1 * | 12/2012 | Itose et al. | 252/520.1 |

\* cited by examiner

FIG. 4

| No. | In at% | Conductor | Unsuitable for Semi-conductor | Semi-conductor | No. | In at% | Conductor | Unsuitable for Semi-conductor | Semi-conductor |
|---|---|---|---|---|---|---|---|---|---|
| 1 | 81.0 | ○ | | | 12 | 63.8 | ○ | | |
| 2 | 80.0 | ○ | | | 13 | 62.6 | ○ | | |
| 3 | 78.0 | ○ | | | 14 | 60.0 | ○ | | |
| 4 | 72.0 | | ○ | | 15 | 56.0 | | ○ | |
| 5 | 70.0 | | | ○ | 16 | 54.0 | | ○ | |
| 6 | 70.1 | | | ○ | 17 | 49.0 | | ○ | |
| 7 | 69.3 | | | ○ | 18 | 45.0 | | ○ | |
| 8 | 67.6 | | | ○ | 19 | 42.0 | | ○ | |
| 9 | 67.6 | | | ○ | 20 | 40.0 | | ○ | |
| 10 | 65.2 | | | ○ | 21 | 35.0 | | ○ | |
| 11 | 65.1 | | | ○ | 22 | 30.0 | | ○ | | a
OXIDE SEMICONDUCTOR SPUTTERING TARGET, METHOD OF MANUFACTURING THIN-FILM TRANSISTORS USING THE SAME, AND THIN FILM TRANSISTOR MANUFACTURED USING THE SAME

CROSS REFERENCE TO RELATED APPLICATION

The present application claims priority from Korean Patent Application Numbers 10-2012-0057851 and 10-2013-0051644 filed on May 31, 2012 and May 8, 2013, respectively, the entire contents of which applications are incorporated herein for all purposes by this reference.

BACKGROUND OF THE INVENTION

1. Field of the Invention

The present invention relates to an oxide semiconductor sputtering target, a method of manufacturing thin-film transistors (TFTs) using the same, and a TFT manufactured using the same, and more particularly, to an oxide semiconductor sputtering target which is used for depositing a thin film having high electron mobility and high operational reliability, a method of manufacturing TFTs using the same, and a TFT manufactured using the same.

2. Description of Related Art

Thin-film transistors (TFTs) are mainly used as pixel switching devices for an active matrix flat panel display, even though they are also used as static random access memory (SRAM) or read-only memory (ROM). For instance, TFTs are used as switching devices or current driving devices of a liquid crystal display (LCD) or an organic light-emitting display (OLED). TFTs used as switching devices enable pixels to be independently controlled so that the pixels can express unique electrical signals different from each other.

Currently, all of LCDs and OLEDs use TFTs each of which has a silicon (Si)-based active layer. However, amorphous Si used in LCDs has a low operation speed and is instable due to low electron mobility of about 0.5 cm$^2$/Vs. Therefore, the ability of amorphous Si to realize a large, high-definition, and high-speed display is limited. In addition, poly-silicon (poly-Si) used in OLEDs exhibits better TFT device characteristics, such as electron mobility, than amorphous Si since it is crystallized using an excimer laser. However, it is impossible to manufacture a large device from poly-Si, which is problematic.

Recently, as an approach to overcome these problems, a TFT having an active layer based on an oxide is gaining interest as a driving device of the next-generation display device. However, it is difficult to commercialize this approach due to its lower yield and operational reliability in an actual process. It is also difficult to apply this approach to the next-generation, larger, high-definition and high-speed display since it has lower electron mobility than poly-Si.

The information disclosed in the Background of the Invention section is provided only for better understanding of the background of the invention, and should not be taken as an acknowledgment or any form of suggestion that this information forms a prior art that would already be known to a person skilled in the art.

BRIEF SUMMARY OF THE INVENTION

Various aspects of the present invention provide an oxide semiconductor sputtering target which is used for depositing a thin film having high electron mobility and high operational reliability, a method of manufacturing thin-film transistors (TFTs) using the same, and a TFT manufactured using the same.

In an aspect of the present invention, provided is an oxide semiconductor sputtering target which is used in a sputtering process for depositing an active layer of a TFT. The oxide semiconductor sputtering target is made of a material based on a composition including indium (In), tin (Sn), gallium (Ga) and oxygen (O).

In an exemplary embodiment of the present invention, the composition may include gallium oxide, tin oxide and indium oxide, in which the content ratios of the In, the Ga and the Sn are, by atomic percent, 60 to 70, 10 to 25 and 5 to 30 with respect to a total of In+Ga+Sn.

In another aspect of the present invention, provided is a method of manufacturing TFTs that includes the step of depositing an active layer using the above-described oxide semiconductor sputtering target. The thin-film transistor may be used in a display device, such as a liquid crystal display (LCD) or an organic light-emitting display (OLED).

In a further aspect of the present invention, provided is a thin film transistor comprising an active layer that comprises a material based on a composition including indium (In), tin (Sn), gallium (Ga) and oxygen (O). The content ratios of the In, the Ga and the Sn may be, by atomic percent, 60 to 70, 10 to 25 and 5 to 30 with respect to a total of In+Ga+Sn.

According to embodiments of the present invention, the oxide semiconductor sputtering target is formed from a quaternary semiconductor material based on the composition including In, Sn, Ga and O, and an active layer of a TFT is deposited using the oxide semiconductor sputtering target. Accordingly, the resultant active layer can exhibit higher electron mobility and operational reliability than an active layer of the related art that is formed from a quaternary semiconductor material based on a composition including In, Ga, Zn and O. It is therefore possible to improve the performance of the TFT and a display device having the same while increasing the yield of the TFT.

The methods and apparatuses of the present invention have other features and advantages which will be apparent from, or are set forth in greater detail in the accompanying drawings, which are incorporated herein, and in the following Detailed Description of the Invention, which together serve to explain certain principles of the present invention.

BRIEF DESCRIPTION OF THE DRAWINGS

FIG. 4 is a table showing a result obtained by sorting the characteristics of the thin films of FIG. 3;

DETAILED DESCRIPTION OF THE INVENTION

Figure 1:
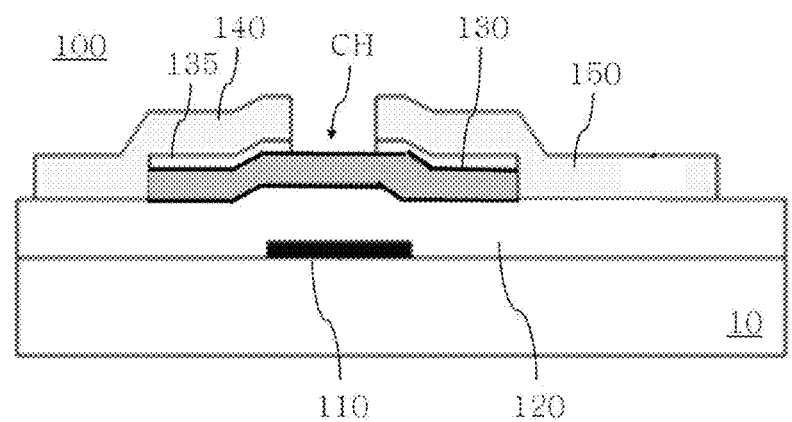
FIG. 1 is a cross-sectional view showing a thin-film transistor (TFT) to which a sputtering target according to an embodiment of the present invention is applied.

Reference will now be made in detail to an oxide semiconductor sputtering target, a method of manufacturing thin-film transistors (TFTs) using the same, and a TFT manufactured using the same according to the present invention, embodiments of which are illustrated in the accompanying drawings and described below, so that a person having ordinary skill in the art to which the present invention relates can easily put the present invention into practice.

Throughout this document, reference should be made to the drawings, in which the same reference numerals and signs are used throughout the different drawings to designate the same or similar components. In the following description of the present invention, detailed descriptions of known functions and components incorporated herein will be omitted when they may make the subject matter of the present invention unclear.

FIG. 1 is a cross-sectional view showing a TFT to which a sputtering target according to an embodiment of the present invention is applied.

The oxide semiconductor sputtering target according to an embodiment of the present invention is a target that is used in a sputtering process for depositing an active layer 130 of the TFT 100 shown in FIG. 1. The sputtering process is a method of bombarding a target with high-speed plasma particles so that a nearby substrate is deposited with atoms released from the target.

According to an embodiment of the present invention, the oxide semiconductor sputtering target is made of a material based on a composition that includes indium (In), tin (Sn), gallium (Ga) and oxygen (O). For instance, the composition of the sputtering target can include gallium oxide, tin oxide and indium oxide. Here, the content ratios of In, Ga and Sn can be, by atomic percent, 60 to 70, 10 to 25 and 5 to 30 with respect to the total (In+Ga+Sn).

Although FIG. 1 illustrates the TFT having a bottom-gate structure, the present invention is not limited thereto. For example, the sputtering target according to the present invention can be used for depositing a thin film of a variety of TFT structures, such as a TFT having a top-gate structure.

Figure 2:
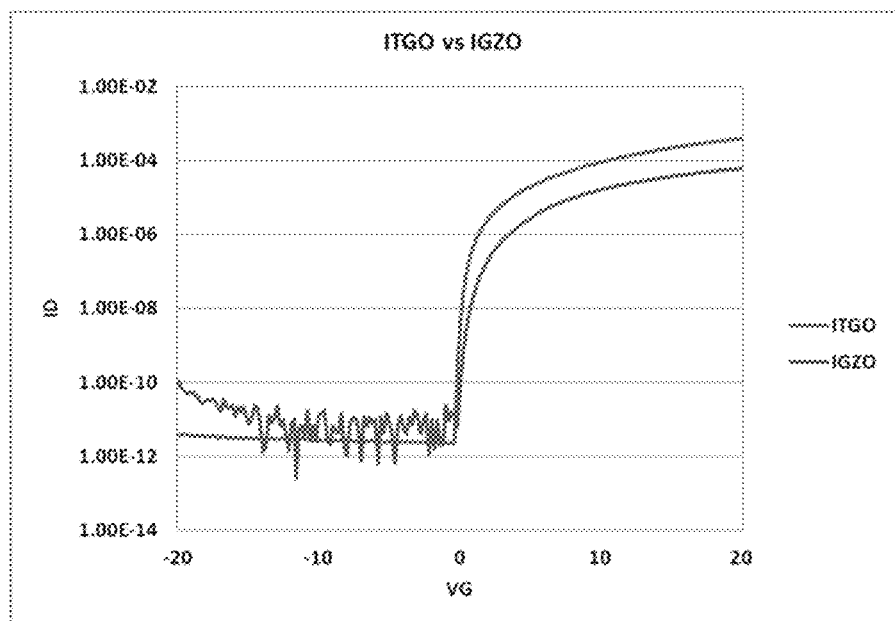
FIG. 2 is a graph showing drain currents depending on gate voltages by the TFT to which a sputtering target according to an embodiment of the present invention is applied and by a TFT of the related art.

FIG. 2 is a graph showing drain currents depending on gate voltages by the TFT to which a sputtering target according to an embodiment of the present invention is applied and by a TFT of the related art.

The active layer 130 of the TFT 100 was deposited by a sputtering process using the oxide semiconductor sputtering target formed from the composition including In, Sn, Ga and O as described above. As shown in FIG. 2, the TFT 100 having the active layer 130 deposited using the oxide semiconductor sputtering target formed from the composition including In, Sn, Ga and O exhibits a high on-off switching ratio. In a high-voltage range (Vg>Vth), the drain current of the TFT 100 having the active layer 130 is about 10 times that of a TFT that is made of a quaternary semiconductor material of the related art based on a composition including In, Ga, Zn and O. In addition, the TFT 100 having the active layer 130 can more rapidly switch since the sub-threshold swing (V/dec), one of major characteristics of a switching device, is low.

Figure 3:
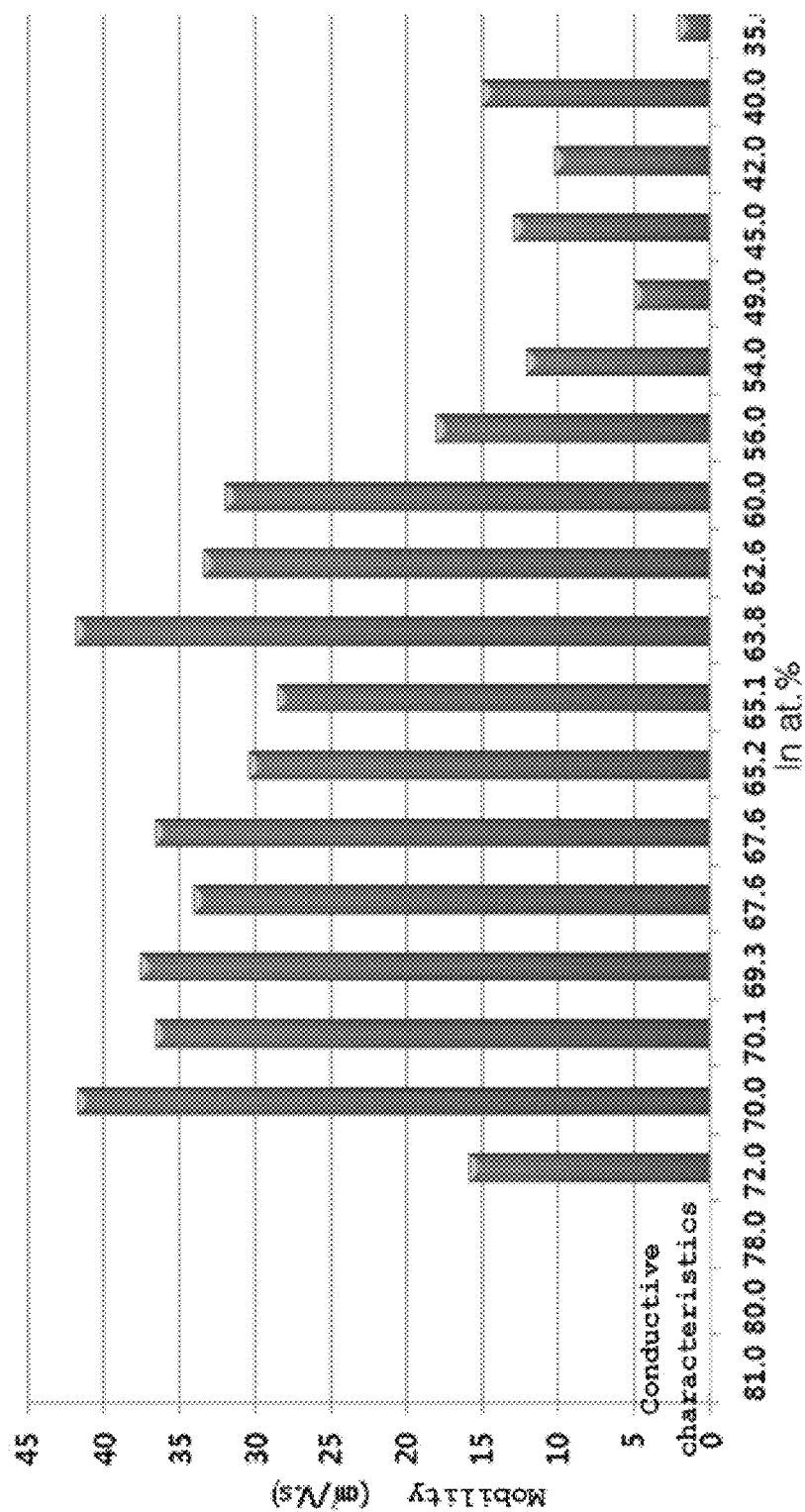
FIG. 3 is a graph showing the electron mobility of thin films depending on the In content of the targets according the present invention.
Figure 5:
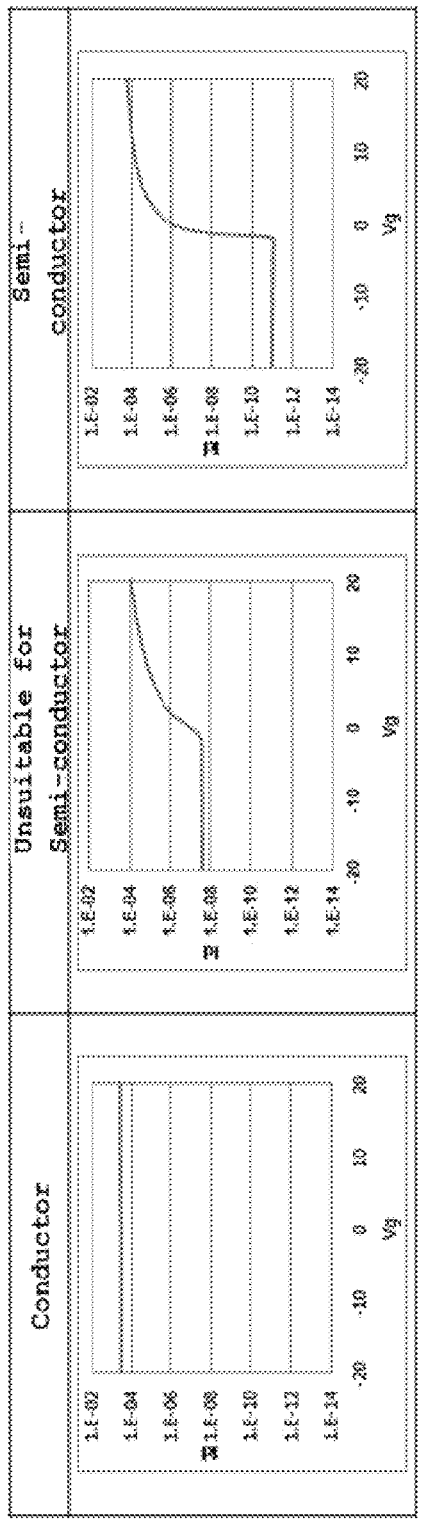
FIG. 5 is a view showing variation in Id content depending on the amount of Vg in TFTs in which a conductive thin film, a thin film which is not suitable as an active layer of a TFT due to its poor characteristics even though it exhibits semiconductive characteristics, and a semiconductor thin film having superior characteristics were used as an active layer.

FIG. 3 is a graph showing the electron mobility of thin films depending on the In content of the targets according the present invention, and FIG. 4 is a table showing a result obtained by sorting the characteristics of the thin films of FIG. 3. In addition, FIG. 5 is a view showing variation in Id content depending on the amount of Vg in TFTs in which a conductive thin film, a thin film which is not suitable as an active layer of a TFT due to its poor characteristics even though it exhibits semiconductive characteristics, and a semiconductor thin film having superior characteristics were used as an active layer.

As shown in the figures, the thin film deposited using a target having an In content less than 60 atomic percent is not suitable to be used as an active layer of a TFT due to low electron mobility even though it exhibits semiconductive characteristics. In addition, the thin film deposited using a target having an In content exceeding 70 atomic percent is unavailable for an active layer of a TFT since it has low electron mobility or exhibits conductive characteristics. In contrast, the thin film deposited using a target having an In content ranging from 60 to 70 atomic percent exhibits superior electron mobility. Accordingly, it can be appreciated that the desirable In content of a target available for the process of forming an active layer according to the present invention ranges from 60 to 70 atomic percent. It is preferred that the electron mobility of the thin film according to the present invention be at least 30 cm$^2$/V·s.

When the active layer exhibits the conductive characteristics, a TFT cannot realize the characteristic of a semiconductor device that switches on and off at a threshold voltage, since a high drain current is measured irrespective of a gate voltage. The TFT using the thin film unsuitable to be used as a semiconductor does not have a significant change in the drain current depending on the gate voltage. In addition, since a high leakage current occurs at a gate voltage that does not exceed the threshold voltage, this TFT exhibits poor performance as a switching device. In contrast, the TFT using the thin film having excellent semiconductive characteristics exhibits superior performance as a switching device, since it shows a significant change in the drain current depending on the gate voltage.

Figure 6:
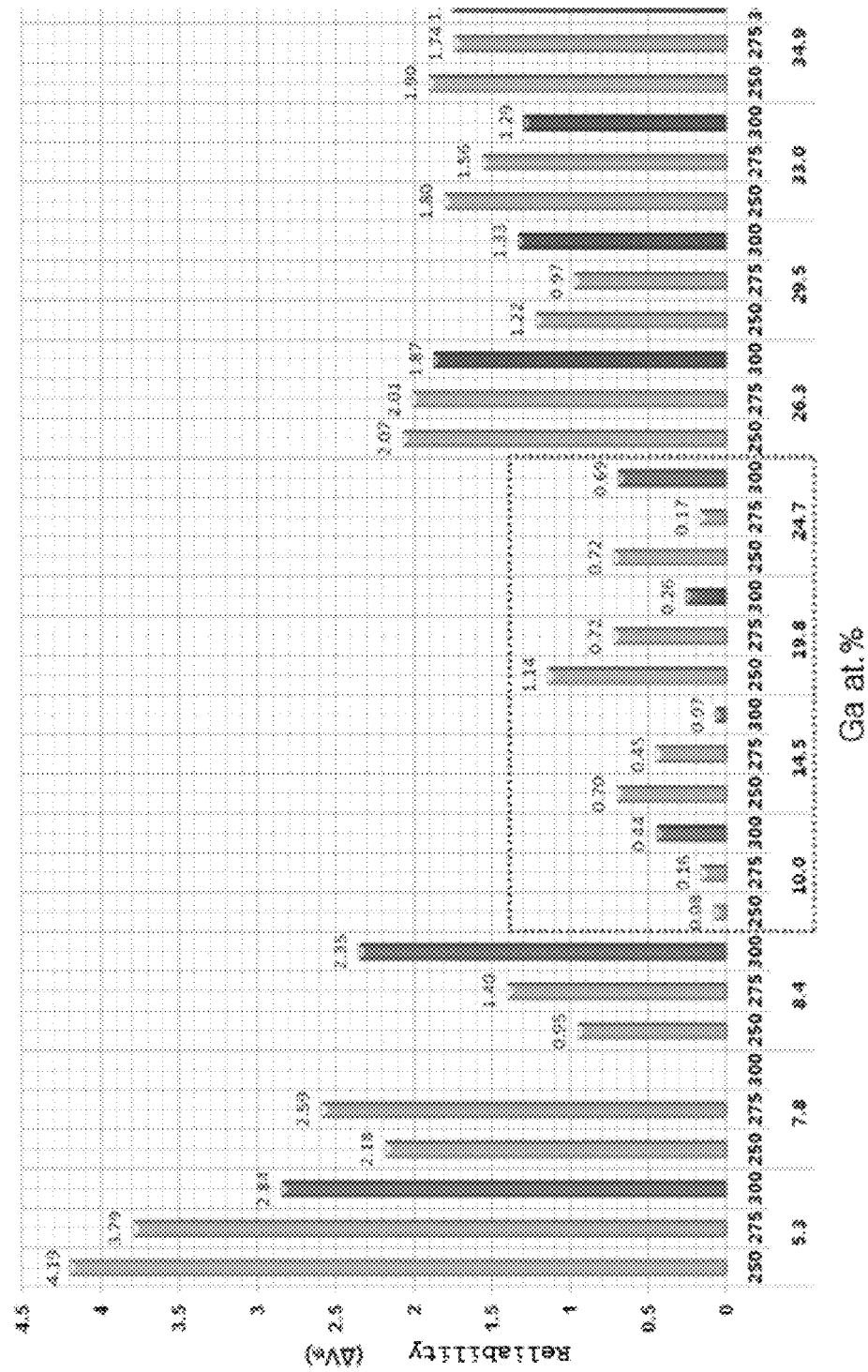
FIG. 6 is a graph showing the operational reliability of a TFT device depending on the Ga content of a target according to the present invention.

FIG. 6 is a graph showing the operational reliability of a device depending on the Ga content of a target according to the present invention.

As shown in FIG. 6, when Ga content of a target ranges from 10 to 25 atomic percent, a thin film formed using this target has high operational reliability, and can be preferably used as an active layer of a TFT. Here, the operational reliability of the device is obtained by measuring a change in the threshold voltage $V_{th}$ after the device is subjected to a multifactor stress that includes heat, light and a bias. The reliability is higher when the change is smaller.

The target having the above-mentioned composition and content ratios can be manufactured by mixing gallium oxide powder, tin oxide powder and indium oxide powder at the above-mentioned content ratios, forming the mixture by a forming method, such as cold pressing, slip casting, filter pressing, cold isostatic pressing, gel casting, centrifugal sedimentation or gravimetric sedimentation, followed by sintering. In addition, the target manufactured in this fashion can be used in the sputtering process in the state in which it is bonded to and supported by a backing plate made of, for example, a metal.

In the meantime, the TFT 100 which includes the active layer 130 deposited using the oxide semiconductor sputtering target according to an embodiment of the present invention is used as a switching device or a current driving device of a liquid crystal display (LCD) or an organic light-emitting display (OLED). The TFT 100 includes a gate electrode 110, a gate insulating film 120, the active layer 130, a source electrode 140 and a drain electrode 150.

In the meantime, a substrate 10 can be made of glass, a semiconductor wafer, metal oxide, a ceramic material, plastic or the like which can satisfy thermodynamic and mechanical requirements for the TFT 100. In particular, the substrate 10 is preferably glass or plastic, but the present invention is not limited thereto.

The gate electrode 110 is formed on the substrate 10. When applied to a display, the gate electrode 110 diverges from a gate line (not shown) which is arranged on the substrate 10 in a first direction, for example, a transverse direction. The gate electrode 110 is applied with a voltage which is to switch on/off the TFT 100. For this, the gate electrode 110 can be made of a conductive material such as metal or metal oxide. For instance, the gate electrode 110 can be made of a metal, such as Pt, Ru, Au, Ag, Mo, Al, W or Cu, or a metal or conductive oxide, such as indium zinc oxide (IZO) or indium tin oxide (ITO). The gate electrode 110 is formed by depositing the above-mentioned conductive material on the substrate 10 and then patterning the resultant structure, in particular, simultaneously with the gate line (not shown) in the same process.

The gate electrode 110 can include a diffusion barrier film (not shown) and a Cu film deposited on the diffusion barrier film (not shown). The diffusion barrier film (not shown) prevents Cu atoms from diffusing into the substrate 10, and intended to increase the bonding force and electrical characteristic of Cu. The diffusion barrier film (not shown) can have a composition that includes at least one selected from among, but not limited to, Ti, Ta, Mo, Cr, Ni and Pt.

The gate insulating film 120 can be made of an insulating material that is used in a typical semiconductor device, in particular, a Si oxide or Si nitride. For instance, the gate insulating film 120 can be made of $SiO_2$ or a high-K material, such as $HfO_2$, $Al_2O_3$, $Si_3N_4$ or a mixture thereof, the dielectric constant of which is higher than that of $SiO_2$.

The active layer 130 is formed on the portion of the gate insulating film 120 that corresponds to the gate electrode 110, and has a channel area CH. According to an embodiment of the invention, the active layer 130 is deposited on the gate insulating film 120 by the sputtering process using the oxide semiconductor sputtering target according to an embodiment of the invention as described above, i.e. the sputtering target having the composition that includes, by atomic percent, 60 to 70% of In, 10 to 25% of Ga and 5 to 30% of Sn with respect to the total (In+Ga+Sn), followed by patterning.

Accordingly, the active layer 130 having the above-described composition and content ratios can exhibit higher electron mobility and reliability than an active layer of the related art that is formed from a quaternary semiconductor material based on a composition including In, Ga, Zn and O, and thus the performance of the TFT 100 including the active layer 130 can also be improved.

The source electrode 140 and the drain electrode 150 are arranged on the active layer 130 such that they are spaced apart from each other. Each of the source electrode 140 and the drain electrode 150 can be made of a conductive material, such as metal, and include a diffusion barrier film (not shown) and a Cu film deposited on the diffusion barrier film (not shown) like the gate electrode 110.

The source electrode 140 is connected to a data line (not shown) which is arranged on the substrate 10 in a second direction, for example, a lengthwise direction that perpendicularly intersects the gate line (not shown). The drain electrode 150 is connected to the pixel electrode (not shown).

In the meantime, an ohmic contact layer 135, or an impurity semiconductor layer, can be formed between the active layer 130 and the source and drain electrodes 140 and 150.

Although not shown in FIG. 1, the TFT can include a protective layer (not shown) or the like which is formed on the source and drain electrodes. The protective layer (not shown) can be made of a material, such as $SiO_2$ or SiNx, or any one of the other oxides.

The TFT 100 to which the sputtering target according to an embodiment of the present invention is applied is used as a switching device or a current driving device. For instance, although not shown, the TFT 100 can used in a liquid crystal display (LCD) which includes upper and lower substrates which face each other, a liquid crystal layer which is sandwiched between the upper and lower substrates, and a backlight which is disposed on the rear surface of the lower substrate such that it emits light forward. In this case, the TFT 100 is disposed on the lower substrate on which a plurality of gate lines and a plurality of data lines are disposed, in particular, in a pixel area on the lower substrate that is defined by the intersection of the lines. The upper substrate has a color filter that corresponds to the pixel area. In addition, an optical film (not shown) which compensates for the optical characteristics of the LCD can be disposed on the upper surface of the upper substrate of the LCD.

In addition to LCDs, the TFT 100 to which the sputtering target according to an embodiment of the present invention is applied can also be used in an organic light-emitting display (OLED). In this case, the TFT 100 is disposed on the lower substrate on which a plurality of gate lines and a plurality of data lines are disposed, in particular, in a pixel area on the lower substrate that is defined by the intersection of the lines. Here, organic light-emitting devices are disposed on the lower substrate. The lower substrate is bonded with the upper substrate, thereby forming an organic light-emitting panel of the OLED. Each of the organic light-emitting devices includes an anode, a cathode, and a hole transportation layer, an emission layer and an electron transportation layer which are positioned between the anode and cathode. Here, a hole injection layer between the anode and the hole transportation layer and an electron injection layer between the electron transportation layer and the cathode can also be provided in order to more efficiently inject holes and electrodes. In this configuration, holes that are injected into the emission layer through the hole injection layer and the hole transportation layer from the anode and electrons that are injected into the emission layer through the electron injection layer and the electron transportation layer from the cathode form excitons that give off light corresponding to the energy gap between the holes and electrons. Here, the anode can be made of a material, such as indium tin oxide (ITO) or indium zinc oxide (IZO), which has a high work function and is transparent, and the cathode can be made of a material, such as aluminum (Al), calcium (Ca) or an aluminum alloy, which has a low work function and is chemically stable.

In addition, an optical film (not shown) which compensates for the optical characteristics of the OLED can also be disposed on the upper surface of the upper substrate of the OLED.

The foregoing descriptions of specific exemplary embodiments of the present invention have been presented with respect to the drawings. They are not intended to be exhaustive or to limit the present invention to the precise forms disclosed, and obviously many modifications and variations are possible for a person having ordinary skill in the art in light of the above teachings.

It is intended therefore that the scope of the present invention not be limited to the foregoing embodiments, but be defined by the Claims appended hereto and their equivalents.

What is claimed is:

1. An oxide semiconductor sputtering target which is used in a sputtering process for depositing an active layer of a thin-film transistor,
   consisting essentially of indium (In), tin (Sn), gallium (Ga) and oxygen (O),
   content ratios of the In, the Ga and the Sn being, by atomic percent, 60 to 70, 10 to 25 and 5 to 30 with respect to a total of In+Ga+Sn.

2. A method of manufacturing thin-film transistors,
   comprising depositing an active layer using the oxide semiconductor sputtering target as recited in claim 1.

3. The method of claim 2, comprising annealing the active layer in a temperature ranging from 200 to 400° C. after depositing the active layer.

4. The method of claim 3, comprising annealing the active layer in a temperature ranging from 250 to 350° C. after depositing the active layer.

5. The method of claim 2, wherein the thin-film transistor is a thin-film transistor that is provided in a liquid crystal display or an organic light-emitting display.

6. A thin film transistor
   comprising an active layer that consists essentially of indium (In), tin (Sn), gallium (Ga) and oxygen (O),
   wherein the active layer has content ratios of the In, the Ga and the Sn, by atomic percent, 60 to 70, 10 to 25 and 5 to 30 with respect to a total of In+Ga+Sn.

* * * * *